United States Patent [19]

Eul

[11] 4,152,745
[45] May 1, 1979

[54] MAGNETIC SHIELD DEVICE

[76] Inventor: Edward A. Eul, 3004 Indian Wood Rd., Wilmette, Ill. 60091

[21] Appl. No.: 786,374

[22] Filed: Apr. 11, 1977

[51] Int. Cl.² .............................................. G05F 7/00
[52] U.S. Cl. ................................... 361/146; 313/479;
315/8; 335/214
[58] Field of Search ............ 361/143, 146; 174/35 R,
174/35 CE, 32, 36; 335/214, 301; 313/479, 153,
160, 402; 336/84 R, 84 C, 84 M; 315/8, 85

[56] References Cited
U.S. PATENT DOCUMENTS

| | | | |
|---|---|---|---|
| 2,343,630 | 3/1944 | Atwood | 313/479 |
| 2,907,914 | 10/1959 | Brownell | 313/479 X |
| 3,018,401 | 1/1962 | Stanley | 315/8 UX |
| 3,824,515 | 7/1974 | Holman | 335/214 X |

*Primary Examiner*—Harry E. Moose, Jr.
*Attorney, Agent, or Firm*—Van Meter Lund

[57] ABSTRACT

A magnetic shield device is provided wherein an object to be shielded from an ambient field is surrounded by a hollow member of high permeability material which has an opening therein permitting visual or other access to the object but also permitting possible entry of a disturbing portion of the ambient field. A counter magnetic field for opposing and cancelling the disturbing field portion is produced by current flow through a conductor wound around the path of the disturbing field portion, the conductor preferably being in the form of a solenoid coil wound around a tubular portion of the member. A DC current may be applied and/or the conductor may be short-circuited with the current being produced from a counter electromotive force induced from changes in the ambient field.

6 Claims, 7 Drawing Figures

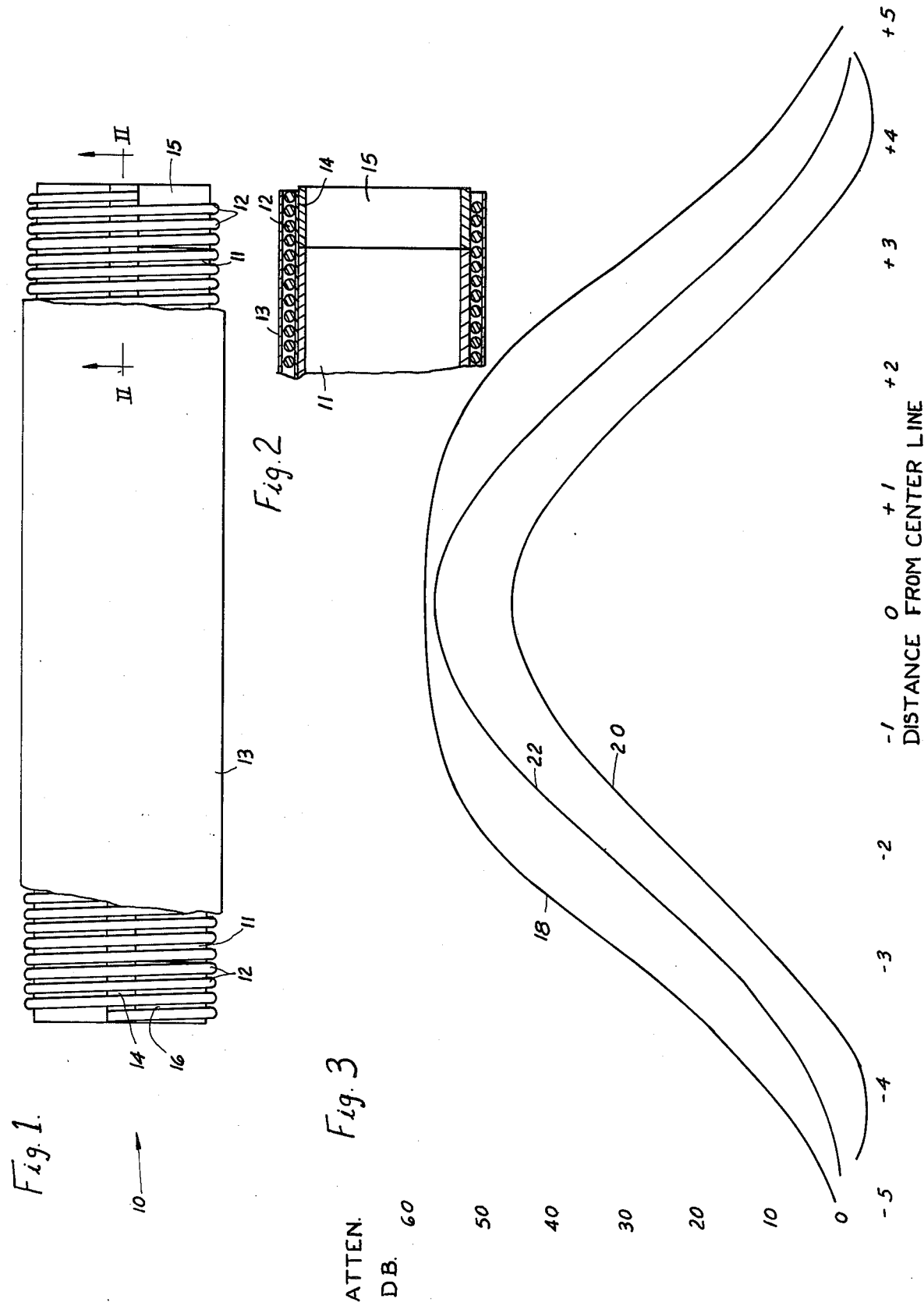

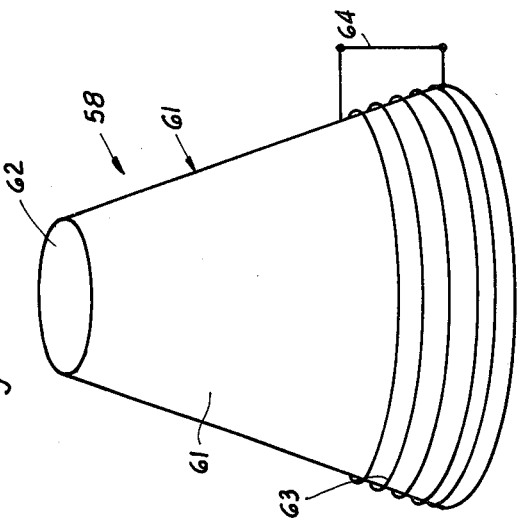
Fig. 4
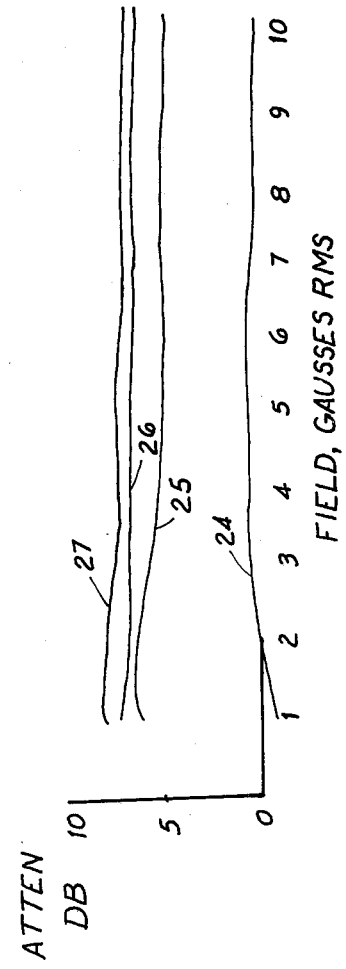
Fig. 5
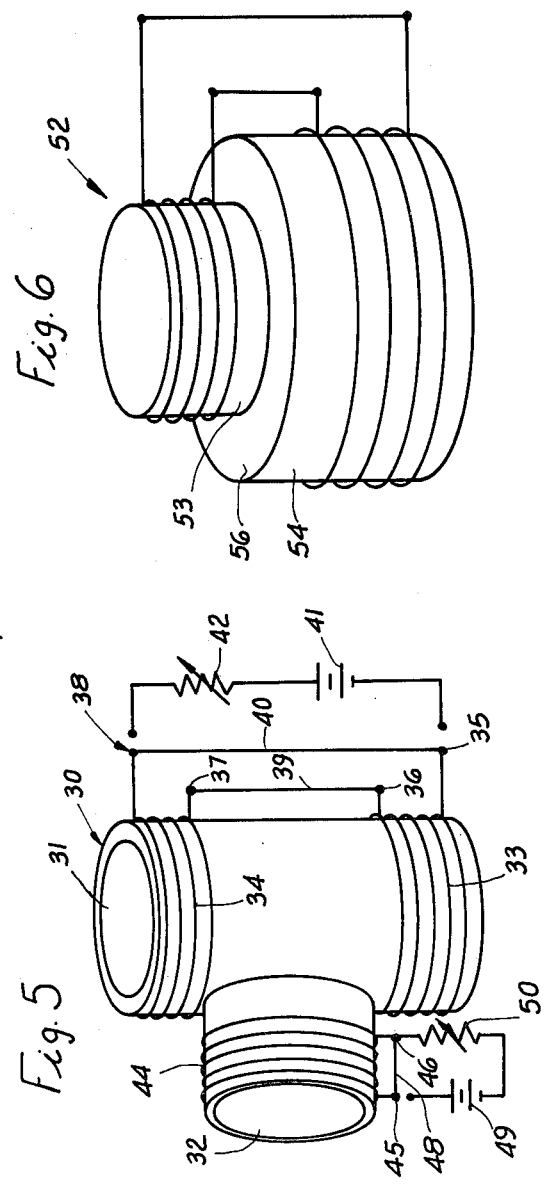
Fig. 6
Fig. 7

MAGNETIC SHIELD DEVICE

This invention relates to a magnetic shield device and more particularly to a device which permits access to an object while providing very high attenuation out of otherwise disturbing portions of an ambient field. The device is highly effective while being relatively simple and economically manufacturable.

BACKGROUND OF THE INVENTION

The field of magnetic shielding is not well understood and is often referred to as a "black art." It is generally believed that shields of high conductivity materials such as copper or aluminum will reduce disturbing alternating fields generally referred to as "EMT" which stands for electromagnetic interference. Such shields are, indeed, quite effective with respect to higher frequency field components. Their effect, however, is limited to the depth of penetration of eddycurrents which is a function of conductivity and also of frequency. At low frequencies, such as 60 Hz, the thickness requirements would be such as to make shields of conductive materials completely impractical. For low frequencies, shields of high permeability material have been used with varying degrees of success. When such shields are of high permeability material or of large thickness and when the shield has no opening so as to completely surround an object to be shielded or when the direction of the shield is such that it does not penetrate any opening in the shield, the shield can be highly effective. However, in many cases, as in shielding cathode ray tubes, photomultiplier tubes and the like, for example, an opening is required for visual or other access to the object and the orientation of the ambient field relative to the desired orientation of the object is either not stable or is not controllable.

Accordingly, it has not been possible to insure satisfactory results. The practice has been to use very high permeability materials, to limit the sizes of openings as much as possible and to hope for the best. If low frequency fields are still a problem, attempts may be made to locate the source of the disturbing field and to try erection of suitable shields close to the source. For example, if the source is a large electric motor, a large panel of a relatively high permeability material may be disposed between the motor and the object to be protected. In any event, it is frequently necessary to go to a great deal of trouble and expense to solve the problem if it can be solved at all.

SUMMARY OF THE INVENTION

This invention was evolved with the general object of overcoming the disadvantages of prior art shield devices and of providing a device which allows access to an object to be shielded while being highly effective in shielding the device from low frequency fields.

Another object of the invention is to provide a device which is highly effective and at the same time relatively simple in construction and economically manufacturable.

In a shield device constructed in accordance with the invention, a hollow shield member of high permeability material is disposed in surrounding relation to an object to be shielded and has at least one opening permitting access to the object but also permitting the possible entry of a disturbing portion of an ambient field. The shield member is thus similar to prior art types. However, in accordance with the invention, the shield member is combined with a conductor which extends around the disturbing field portion path for developing a counter-magnetic field to at least partially oppose and cancel the effect of the disturbing field portion. With the combination of the shield member and the conductor, highly effective shielding can be obtained as to low frequency ambient fields oriented in any direction. Field components which are in a direction transverse to the principal axis of the opening in the shield member are prevented from reaching the object through the normal operation of the shield member. Field components which are in the direction of the principal axis of the opening are opposed or cancelled through current flow through the conductor.

It is noted that it is possible to use a conductor for this purpose because of the combination thereof with the shield member of magnetic material which limits the potentially disturbing field components to those lying along the principal axis of the opening. It would not be possible to effectively shield by current flow through a conductor alone, nor is it possible to use a shield member alone for reliable shielding when the shield member has an opening therein, as pointed out above.

The device of the invention is especially advantageous for shielding of low frequency shield components such as 60 Hz field components and lower frequency components down to and including uni-directional field components of substantially zero frequency having substantially constant magnitude and direction. For such uni-directional field components, a DC current is passed through the conductor having a magnitude such as to produce a counter field to cancel the uni-directional field component.

For varying or alternating field components, means are provided for interconnecting terminal end portions of the conductor to obtain current flow therethrough in proportion to electromotive forces induced in the conductor by variations in the portion of the ambient magnetic field which extends through or within the conductor.

Preferably, the shield member is disposed within the conductor which has very important advantages in that the conductor surrounds both the field passing through the opening in the shield member and the field passing through the shield member itself. The magnitude of the field passing through the opening is quite small, it being the objective of the device to make it as small as possible. The magnitude of the field passing through the shield member can be quite large with the shield member being of a very high permeability material and being operative to perform a gathering effect on the ambient field. Accordingly, the electromotive force induced in the conductor in response to variations in the field and the resultant current flow are correspondingly large. The strength of the counter-magnetic field is therefore also large and it is possible to obtain a nearly exact balance at the opening in the field member between the portion of the counter-magnetic field therein and the ambient field component which would otherwise enter the opening. Thus the device obtains a nearly exact cancelling effect or what may be alternatively described as a very high attenuation of disturbing field components.

In accordance with a specific feature, the conductor is in the form of a multi-turn solenoid type of coil around a tubular portion of the shield member which has a terminal end defining the opening. It is found that improved results are obtained when such a coil is used as compared with a conductor in the form of a ring or cylinder. An exact explanation of the improved results is not known but apparently it has to do with field distributions involved in inducing electromotive forces in the conductor and those involved in producing the counter-magnetic field at the opening from current flow in the conductor. Preferably, the coil has an outer end in proximity to the outer end of the tubular portion of the shield member and most preferably it extends a short distance beyond the outer end of the tubular portion of the shield member. With the proper configuration and relationships, maximum attenuation of disturbing portions of an ambient field can be produced at the opening in the shield member.

This invention contemplates other objects, features and advantages which will become more fully apparent from the following detailed description taken in conjunction with the accompanying drawings.

BRIEF DESCRIPTION OF THE DRAWINGS

FIG. 1 is a top plan view of a magnetic shield device constructed in accordance with the principles of the invention;

FIG. 2 is a cross-sectional view, taken substantially along line II—II of FIG. 1;

FIG. 3 is a graph showing field attenuation obtained at various points under various conditions;

FIG. 4 is another graph illustrating the attenuation obtained with varying field intensity and with various different modes of construction;

FIG. 5 illustrates diagrammatically a modified form of device including two cylindrical portions at right angles to each other;

FIG. 6 illustrates another modified form of device including two coaxial cylindrical portions of different diameters; and FIG. 7 illustrates still another modified form of device of conical shape.

DESCRIPTION OF PREFERRED EMBODIMENTS

Reference numeral 10 generally designates a magnetic shield device constructed in accordance with the principles of this invention. The device 10 comprises a shield member 11 of magnetic material, preferably a material having a very high permeability, typical types of materials being described hereinafter. The illustrated shield member 11 is in the form of a cylinder which might be used, for example, in shielding an object such as a cathode ray tube in which case the shield must have an opening permitting visual or other access to the device, e.g. the opening must be transparent to light so as to permit observation of the screen of the tube or, in the case of the camera or photo-multiplier tube, to permit an image to be impinged on the device. In the illustrated device, both ends of the shield member 11 are open but it will be understood that only one end may be open, with the other being closed.

The shield member 11, by itself, is highly effective as to portions of an ambient field which extend in a direction transverse to the axis of the member 11 but it is much less effective as to an axially oriented disturbing field portion which can extend in a path through the openings at the opposite ends of the member. In accordance with this invention, the shield member 11 is combined with a conductor 12 which extends around the path of an axially extending disturbing field portion for developing a counter-magnetic field which at least partially opposes and cancels the effect of the disturbing field portion.

The conductor 12 of the illustrated device 10 is in the form of a multi-turn axially extending or solenoid type coil which in the illustrated device is enclosed by an optional cover 13 of non-magnetic material, end portions of the cover being shown broken away to show end portions of the coil. In the case of a cylindrical field member which is open at both ends, the coil may preferably extend for the full length of the member but such is not necessarily required to be the case.

The device 10 which is designed for shielding with respect to alternating or varying fields, includes an axially extending conductor 14 which interconnects opposite ends of the conductor 12 to thus short circuit the coil formed by conductor 12. The ends of the coil formed by the conductor 12 are preferably in proximity to and most preferably project slightly beyond the terminal ends of the shield member 11 as illustrated and annular members 15 and 16 of non-magnetic material may be secured to the ends of the member 11 to support the projecting end portions of the coil formed by the conductor 12.

In operation, varying or alternating field components induce electromotive forces in the conductor 12 and through the short-circuit provided by the conductor 14, a proportional current flow is produced to develop a counter-field opposing and cancelling the portion of the ambient field which would otherwise enter through the ends of the member 11. As discussed above, the fact that the shield member 11 of high permeability material is disposed within the conductor 12 is important, the shield member 11 being operative to perform a gathering effect on the ambient field to increase the magnitude of the field within the conductor 12, the electromotive force induced therein, the current flow and the strength of the counter-magnetic field.

The operation of the device and its advantages are illustrated graphically in FIG. 3 which is a plot of attenuation in decibels versus the position of a field measuring probe along the axis of the device. To obtain data as graphically illustrated, the device was placed in a Helmholtz coil system comprising two four-foot diameter coils disposed coaxially in parallel planes one radius (two feet) apart, such a system providing a uniform field in a region approximately 12 inches in diameter and 16 inches long at the center of the coil pair. Current at a frequency of 60 Hz was applied to obtain a field of 3 gauss RMS. The device was then placed in the uniform field region and the probe was moved along the axis of the device. Curve 18 shows the attenuation obtained when the ambient field, in this case the field produced by the Helmholtz coil pair, is at right angles to the axis of the device. The attenuation is, of course, at a maximum at the center line of the device, i.e. at a position midway between the opposite ends thereof. As the probe is moved away from the center line, the attenuation is reduced, but it is noted that even when the probe is moved beyond the ends of the device, the attenuation is still significant, which is due to the presence of the very high permeability material which gathers the magnetic field and draws it away from regions where it might otherwise be present. In the illustration, zero measured attenuation is not obtained until the probe is moved approximately 2 inches beyond the end of the device, the device having a length of 6 inches.

Curve 18, being obtained from a transverse field, is the same whether or not the conductor 12 is provided.

Curve 20 illustrates the attenuation obtained without the conductor 12 (or with the short-circuit provided by conductor 14 being removed). Relatively high attenuation is obtained at the center line of the device but the attenuation is reduced as the ends of the device are approached, being approximately zero at each end thereof. At positions beyond the ends, a negative attenuation is obtained, i.e. the field intensity is actually greater than it would be if no device were used. This results from the gathering effect performed by the member of very high permeability material.

Curve 22 illustrates the attenuation obtained with the coiled conductor 12 short-circuited by the conductor 14. The attenuation of the axially extending field is greatly increased, as compared with what it would be without the coiled conductor, being increased by a factor of on the order of eight decibels. The attenuation approaches that obtained with respect to the transverse field component. In other words, the device is effective in shielding against fields in any direction.

Although, as above noted, it is not essential that the coil extend for the full length of the shield member, it is desirable that it should extend axially for a substantial distance along a tubular portion of the member and it is also desirable that the end of the coil be in proximity to an end of a tubular portion of the shield member. Most preferably, the end of the coil extends beyond the end of the shield member of magnetic material.

FIG. 4 is another graph in which measured attenuation is plotted against field intensity under various conditions. In all cases depicted in FIG. 4 a probe was placed on the axis of a shield member such as the member 11 and in alignment with one end of such member to measure the axial field and to thereby measure the field at the entrance opening to the member. Curve 24 was obtained with no conductor or coil (or with the short circuit of a coiled conductor such as conductor 12 removed), the attenuation being very close to zero at all field levels measured.

Curve 25 is obtained with a coiled conductor such as conductor 12 disposed with its terminal end in alignment with the terminal end of a shield member such as member 11. In this case a high attenuation is obtained, being highest at relatively low field intensities and being decreased somewhat as the field intensity is increased. Curve 26 shows the attenuation obtained with a coiled conductor such as conductor 12 having its terminal end approximately one inch beyond the terminal end of the shield member. In this case, the attenuation is increased still further, again being reduced slightly as the field intensity is increased.

Curve 27 shows the attenuation produced with the construction as illustrated in FIG. 1 in which the terminal end of the coiled conductor 12 is approximately 0.25 to 0.5 inches beyond the terminal end of the shield member 11. In this case, a still higher attenuation is obtained, again being higher at lower field intensities that decrease as the field intensity is increased.

FIG. 4 thus shows that the relationship of the coiled conductor to the shield member is important in maximizing the attenuation at the entrance opening, it being noted that by increasing the attenuation at the entrance opening, the attenuation at all points within the shield member is also increased.

In maximizing attenuation in any particular application, the relative physical relationship of the coiled conductor to the shield member as well as the size and number of turns of the conductor may be adjusted to obtain maximum observed attenuation.

With regard to the materials used in the shield member 11, any one of a number of alloys may be used which are known in the art and which are composed of approximately 80% nickel with the balance being either iron alone or iron and other metals, such alloys providing permeabilities of up to 500,000 or higher. Such very high permeability materials are marketed under various trade names and examples of usable formulations include (1) 80% nickel and 20% iron, (2) 78% nickel, 4-5% copper, 2% chromium and the balance iron, and (3) 80% nickel, 4% molybdenum and the balance iron. The invention is not limited to any particular material and it is possible, for example, to use an alloy of 50% nickel and 50% iron, to provide a lower but still very high permeability of on the order of 150,000, and also a higher saturation flux density than is the case with the first-mentioned alloys of higher nickel content. It is also possible to use ordinary sheet steels or other magnetic materials, with the proper dimensions and under appropriate conditions in combination with a conductor in accordance with the principles of this invention.

It is further noted in connection with FIG. 4 that the field distributions involved in inducing electromotive forces in the conductor and in producing the counter-magnetic fields are important. With a multi-turn axially extending coil, the total induced electromotive force is the sum of the electromotive forces of the individual turns which are unequal when the coil is disposed around a tubular shield member of magnetic material in an axially extending field. The current is determined by the total electromotive force provided by the total impedance of the individual turns. The counter-magnetic field is determined in part by the current and in part by the distribution of the field, particularly in that the turns of the coiled conductor closest to the terminal end thereof has the greatest effect on the counter magnetic field at the opening. The exact effects are difficult to analyze and predict, especially when the exact permeability of the shield member material may vary with flux density. For these reasons, it may be necessary to make some tests in order to determine the exact physical relationship which produces maximum attenuation, in any given application. However, it can be stated in general that it is desirable to use a multi-turn coil, that it be disposed around a tubular portion of a shield member with the end of the coil in proximity to the end of the tubular portion of the shield member, most preferably projecting a short distance therebeyond. The conductor is preferably relatively heavy (as opposed to using a large number of turns of fine wire). It need not be of circular cross-sectional configuration, but may be square or rectangular.

FIG. 5 illustrates a modified form of device including a generally T-shaped hollow shield member 30 formed by a first cylindrical portion 31 and a second cylindrical portion 32 at right angles to the portion 31 and joined to a central portion thereof. A pair of coiled conductors 33 and 34 are disposed around opposite end portions of the portion 31 of the shield member 30, the coiled conductor 33 having end terminals 35 and 36 and the coiled conductor 34 having end terminals 37 and 38. Short-circuiting conductors might be provided across each of the coiled conductors 33 and 34 as, for example, by providing a connection between terminals 35 and 36 and another separate connection between terminals 37 and 38. Alternatively, as shown, a conductor 39 is provided between terminals 36 and 37 and another conductor 40 is provided between terminals 35 and 38, the coils 33 and 34 being thereby connected in series-aiding relationship and being also short-circuited. Another alternative, usable for uni-directional fields, is to provide a battery 41 in series with an adjustable resistor 42, such being connectable between terminals 35 and 38, the resistor 42 being adjustable to obtain a counterfield balancing or cancelling the axial component of a disturbing field. The polarity of the battery 41 may be reversed, according to the field direction. Another coil 44 is disposed around the portion 32 and has end terminals 45 and 46 between which a short-circuiting connection 48 may be provided. Alternatively, a battery 49 in series with an adjustable resistor 50 may be used between terminals 45 and 46, in place of the connection 48.

It should be noted that it is also possible to use separate coils with one being short-circuited for cancelling alternating field components and with the other being connected to a DC source for cancellation of uni-directional fields.

FIG. 6 illustrates another modified form of device 52 which includes a shield member 54 having a small diameter portion 53 and a larger diameter portion 54 disclosed coaxially in end-to-end relationship, with a wall 55 at the junction between the two portions 53 and 54. Coiled conductors 55 and 56 are disposed around the portions 53 and 54 and may be connected, as shown in a manner similar to the connection of coiled conductors 33 and 34 in the device of FIG. 5. Alternatively, each of the coiled conductors 55 and 56 may be short-circuited, through separate connections, or as another alternative, an adjustable DC current source may be provided.

FIG. 7 shows still another modified form of device 58 which includes a shield member 60 having a frusto-conical wall 61 closed at the smaller diameter end thereof by an end wall 62. The coiled conductor 63 is disposed around the portion 61 adjacent the larger diameter end thereof, which is open, a short-circuiting conductor 64 being provided between end terminals of the coiled conductor 63. Here again, an adjustable DC source may be substituted for the short-circuiting connection 64. The device 58 may be used, for example, in shielding a cathode ray tube of generally conical shape.

With regard to FIG. 3, it is noted that the results illustrated graphically therein were obtained with approximately 84 turns of No. 14 A.W.G. copper wire wound on a shield member of very high permeability material having a length of 6 inches and a diameter of 1.5 inches. As noted in discussing the graph of FIG. 3, the device of the invention is effective in shielding as to fields in any direction and additional tests have been made in this regard. In each of the following described tests, the field was measured at an end position at one end of the shield member, at an intermediate position halfway between the end of the shield member and the center line of the device and at a center position on the center line of the device. In each described test, the attenuation is expressed as the ratio of the measured field intensity without the device to the measured field intensity within the device.

With the ambient field transverse to the coil axis and with the test probe oriented to measure the field along the axis of the device, the attenuation measured with the coil operative was 150, 2100 and 7500 at the end, intermediate and center positions, respectively. Under the same conditions but without the coil being operative, the corresponding measured attenuations were 50, 700 and 2500.

With the ambient field at an angle of 60 degrees relative to the coil axis and with the test probe oriented to measure the field along the axis of the device, the attenuations measured with the coil operative were 12, 210 and 1200 at the end, intermediate and center positions, respectively. Under the same conditions but without the coil being operative, the corresponding measured attenuations were 4, 70 and 400.

With the ambient field at an angle of 45 degrees relative to the coil axis and with the test probe oriented to measure the field along the axis of the device, the attentuations measured with the coil operative were 9, 150 and 975 at the end, intermediate and center positions, respectively. Under the same conditions but without the coil being operative, the corresponding measured attenuations were 3, 50 and 325.

With the ambient field at an angle of 30 degrees relative to the coil axis and with the test probe oriented to measure the field along the axis of the device, the attenuations measured with the coil operative were 9, 15 and 900 at the end, intermediate and center positions, respectively. Under the same conditions but without the coil being operative, the corresponding measured attenuations were 3, 5 and 280.

Still another test was made with the ambient field along the axis of the device and with the probe oriented to measure the field transverse to the axis and the attenuations measured were 650, 6875 and substantially infinity with the coil operative, compared to 130, 1375 and 4890 with the coil inoperative.

It can be seen from an examination of such test results that the advantages of the device are not limited with regard to particular field orientations and that they are obtained in shielding against fields in any direction.

It will be understood that the principles of the invention may be applied to shield configurations different from those illustrated, depending upon the required application, and that other modifications and variations may be effected without departing from the spirit and scope of the novel concepts of this invention.

I claim as my invention:

1. In a magnetic shield device for protecting an object against exposure to ambient magnetic fields which vary at low frequency rates of on the order of 60 Hz, a hollow shield member having a solid wall of high permeability magnetic material for surrounding the object and for providing a very low reluctance path for said ambient fields, said wall of said shield member having at least one opening therein, each opening permitting access to the object but also permitting disturbing portions of said ambient fields to extend in a path through said opening and into the interior of said hollow shield member, a conductor extending around each of said paths and around said shield member with variations in said disturbing portions of said ambient fields being effective to induce electromotive forces in said conductor proportional to the intensity of said disturbing portions and the frequency of variation thereof, said shield member being effective to perform a gathering effect on the ambient fields to increase the field within said conductor and to thereby increase the electromotive forces induced therein, and means providing an electric short circuit between terminal ends of said conductor to cause a current flow in said conductor proportional to the electromotive forces induced therein and inversely proportional to the impedance of said conductor, said current flow being effective to produce counter-magnetic fields to substantially cancel the effect of said disturbing portions of said ambient magnetic fields and to produce an attenuation of the ambient magnetic fields approaching that obtained by a solid wall of said high permeability magnetic material having no opening therein.

2. In a magnetic shield device as defined in claim 1, said shield member including a generally tubular portion having an outer terminal end defining said opening, and said conductor being in the form of a multi-turn solenoid type coil around said tubular portion.

3. In a magnetic shield device as defined in claim 2, said short-circuiting means comprising a conductor connected at opposite ends to said terminal ends of said solenoid type coil and extending generally parallel to the axis of said generally tubular portion.

4. In a magnetic shield device as defined in claim 2, said coil having an outer end in proximity to said outer terminal end of said tubular portion of said shield member.

5. In a magnetic shield device as defined in claim 4, said outer end of said coil being spaced outwardly a short distance beyond said outer terminal end of said tubular portion of said shield member.

6. In a magnetic shield device as defined in claim 5, said short distance being so related to the size, configuration and permeability of said shield member, the size, number of turns and configuration of said coil conductor and the magnitude and frequency of variations in disturbing portions of said ambient field as to produce maximum attenuation of said disturbing portions of said ambient field within said shield member.

* * * * *